United States Patent
Hong et al.

(10) Patent No.: US 11,334,119 B2
(45) Date of Patent: May 17, 2022

(54) DISPLAY PANEL

(71) Applicant: Samsung Display Co., Ltd., Yongin-Si (KR)

(72) Inventors: Jong Ho Hong, Yongin-si (KR); Hye Jin Joo, Suwon-si (KR); Gun Mo Kim, Hwaseong-si (KR); Il Gon Kim, Seoul (KR); Jae Min Shin, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/020,694

(22) Filed: Sep. 14, 2020

(65) Prior Publication Data

US 2020/0409423 A1 Dec. 31, 2020

Related U.S. Application Data

(63) Continuation of application No. 16/584,822, filed on Sep. 26, 2019, now Pat. No. 10,802,545, which is a (Continued)

(30) Foreign Application Priority Data

Aug. 18, 2016 (KR) .................. 10-2016-0105110

(51) Int. Cl.
*G06F 1/16* (2006.01)
*H01L 51/52* (2006.01)
(Continued)

(52) U.S. Cl.
CPC ............. *G06F 1/1652* (2013.01); *B32B 3/08* (2013.01); *B32B 3/263* (2013.01); *B32B 3/266* (2013.01); *G06F 1/1626* (2013.01); *G06F 1/1637* (2013.01); *G06F 3/044* (2013.01); *G06F 3/0412* (2013.01); *H01L 27/1218* (2013.01); *H01L 27/323* (2013.01); *H01L 51/0097* (2013.01); *H01L 51/5246* (2013.01); *B32B 2250/05* (2013.01); *B32B 2250/44* (2013.01);
(Continued)

(58) Field of Classification Search
CPC ............. H01L 51/5246; H01L 51/0097; H01L 27/323; H01L 27/1218; G06F 1/1652; G06F 3/0412
See application file for complete search history.

(56) References Cited

U.S. PATENT DOCUMENTS 10,466,746 B2    11/2019  Hong et al.
10,802,545 B2 *  10/2020  Hong ............... G06F 1/1652
(Continued)

FOREIGN PATENT DOCUMENTS

JP         2008-542834 A      11/2008

*Primary Examiner* — Jose R Diaz
(74) *Attorney, Agent, or Firm* — Innovation Counsel LLP (57) ABSTRACT

The present disclosure relates to a display panel including a display area that can be stretched by including a plurality of stretching units and a peripheral area positioned at an edge of the display area. Each of the stretching units includes: a plurality of islands separately disposed to include a plurality of pixels disposed therein; a plurality of bridges extended from the islands to connect adjacent islands or to connect the islands with the peripheral area; and a plurality of openings disposed adjacent to the bridges, between the bridges, and between the bridges and the islands, wherein areas of the islands are gradually increased toward the peripheral area.

21 Claims, 11 Drawing Sheets

Related U.S. Application Data continuation of application No. 15/678,506, filed on Aug. 16, 2017, now Pat. No. 10,466,746.

(51) Int. Cl.
  *H01L 27/32* (2006.01)
  *G06F 3/041* (2006.01)
  *G06F 3/044* (2006.01)
  *H01L 27/12* (2006.01)
  *H01L 51/00* (2006.01)
  *B32B 3/08* (2006.01)
  *B32B 3/26* (2006.01)

(52) U.S. Cl.
  CPC ... *B32B 2307/206* (2013.01); *B32B 2307/546* (2013.01); *B32B 2457/206* (2013.01); *B32B 2457/208* (2013.01); *G06F 2203/04102* (2013.01); *H01L 27/3262* (2013.01); *H01L 27/3276* (2013.01); *H01L 2251/5338* (2013.01)

(56) References Cited

U.S. PATENT DOCUMENTS

| | | |
|---|---|---|
| 2008/0218369 A1 | 9/2008 | Krans et al. |
| 2010/0330338 A1 | 12/2010 | Boyce et al. |
| 2012/0051005 A1 | 3/2012 | Vanfleteren et al. |
| 2014/0138637 A1 | 5/2014 | Yang et al. |
| 2016/0104756 A1 | 4/2016 | Lee et al. |

\* cited by examiner

DISPLAY PANEL

CROSS-REFERENCE TO RELATED APPLICATION(S)

This application is a continuation application of U.S. patent application Ser. No. 16/584,822 filed Sep. 26, 2019, which is a continuation application of U.S. patent application Ser. No. 15/678,506 filed Aug. 16, 2017, which claims priority to and the benefit of Korean Patent Application No. 10-2016-0105110, filed on Aug. 18, 2016, in the Korean Intellectual Property Office, the disclosure of which is incorporated herein in its entirety by reference.

TECHNICAL BACKGROUND

(a) Technical Field

The technical field relates to a display panel.

(b) Description of the Related Art

A flexible display panel can be included in a rollable display device, a foldable display device, a bendable display device, and/or a stretchable display device. A significant amount of rolling, folding, bending, and/or stretching may result in damage to the display panel due to accumulation of physical breakage or fatigue.

The above information disclosed in this Background section is for enhancement of understanding of the background of this application. The Background section may contain information that does not form the prior art that is already known in this country to a person of ordinary skill in the art.

SUMMARY

Embodiment may be related a display panel, e.g., a flexible and/or stretchable display panel. The display panel may endure a significant amount of use without critical physical breakage between a display area and a peripheral area even if these two areas have different elongation ratios.

An embodiment may be related to a display panel that includes the following elements: a display area including a plurality of stretchable units; and a peripheral area positioned at an edge of the display area, wherein each of the stretchable units includes: a plurality of islands separately disposed to include a plurality of pixels disposed therein; a plurality of bridges extending from the islands to connect adjacent islands or to connect the islands with the peripheral area; and a plurality of openings disposed adjacent to the bridges, between the bridges, and between the bridges and the islands, wherein areas of the islands (gradually) increase toward the peripheral area.

Widths of the bridges may (gradually) increase toward the peripheral area.

Areas of the openings may (gradually) reduce toward the peripheral area.

Areas of the islands may (gradually) increase toward the peripheral area for the stretchable units between the peripheral area and an area which corresponds to 1% of a length/width of the display panel from the peripheral area.

The display panel may include: a substrate including the display area and the peripheral area; and a plurality of insulating layers stacked on the substrate, and the openings may extend through the insulating layers and the substrate.

Each of the openings may have a dumbbell-shaped, circular, cross-shaped, flange-shaped, or polygonal cross-section.

An embodiment may be related to a display panel that includes the following element: a display area including a plurality of stretchable units; and a peripheral area positioned at an edge of the display area, wherein each of the stretchable units includes: a plurality of islands separately disposed to include a plurality of pixels disposed therein; a plurality of bridges extending from the islands to connect adjacent islands or to connect the islands with the peripheral area; and a plurality of openings disposed adjacent to the bridges, between the bridges, and between the bridges and the islands, wherein widths of bridges that connect islands with the edge are wider than bridges that connect islands.

An area of an island that is closest to the edge may be greater than that of an island farther from the edge.

An area of an opening that is closest to the edge may be less than that of another of the openings.

Areas of the islands may (gradually) increase toward the edge for the stretchable units between the peripheral area and an area which corresponds to 1% of a length/width of the display panel from the peripheral area.

The display panel may include a substrate and a plurality of insulating layers stacked on the substrate, and the openings may extend through the insulating layers and the substrate.

An embodiment may be related to a display panel. The display panel may include an insulating layer and a first pixel. The insulating layer may include a first edge, a second edge, and a set of openings. The set of openings may be positioned between the first edge and the second edge and may include a first opening and a second opening. A minimum distance between the first opening and the first edge may be less than a minimum distance between the second opening and the first edge and may be less than a minimum distance between the second opening and the second edge. The first opening may be smaller than the second opening. The first pixel may include a first transistor. The first transistor and/or the first pixel may be positioned between the first opening and the second opening (e.g., in a plan view of the display panel).

The insulating layer may include a third opening and a fourth opening. The third opening immediately neighbors the first opening with no intervening opening. The fourth opening immediately neighbors the second opening without any intervening opening. A minimum distance between the first opening and the third opening may be greater than a minimum distance between the second opening and the fourth opening.

The insulating layer may include a third edge and a fourth edge. The set of openings may be positioned between the third edge and the fourth edge and may include a third opening. A minimum distance between the third opening and the third edge may be less than a minimum distance between the second opening and the third edge and may be less than a minimum distance between the second opening and the fourth edge. The third opening may be smaller than the second opening.

The set of openings may include a fourth opening. The fourth opening may be positioned between the first opening the third edge, may be positioned between the third opening and the first edge, and may be smaller than the second opening.

The fourth opening may extend perpendicular to the first opening.

Shapes of the openings may include at least one of a dumbbell shape, a circular shape, a flange shape, and a polygonal shape.

The set of openings may include a third opening. The third opening may be positioned between the second opening and the second edge and may be larger than the second opening.

The minimum distance between the second opening and the second edge may be less than or equal to 99% of a distance between the first edge and the second edge.

The set of openings may include a third opening. The third opening may be positioned between the second opening and the second edge, may be as large as the second opening, and may be larger than the first opening.

The first opening may immediately neighbor the first edge with no intervening opening. The set of openings may include a third opening. The third opening may immediately neighbor the second opening without any intervening opening. A minimum distance between the first opening and the first edge may be greater than a minimum distance between the second opening and the third opening.

The second opening may extend perpendicular to the first opening.

The set of openings may include a third opening. The third opening may be positioned between the first opening and the second opening, may immediately neighbor each of the first opening and the second opening with no intervening openings, may be larger than the first opening, and may be smaller than the second opening.

A minimum distance between the first opening and the third opening may be greater than a minimum distance between the second opening and the third opening.

The third opening may extend perpendicular to at least one of the first opening and the second opening.

The display panel may include a substrate. The substrate may overlap the first pixel, may overlap the insulating layer, and may include a set of holes. The holes may be respectively aligned with the openings.

The insulating layer may include a third edge and a fourth edge. The set of openings may be positioned between the third edge and the fourth edge. A minimum distance between the first opening and the third edge may be greater than a minimum distance between the second opening and the third edge. A minimum distance between the first opening and the fourth edge may be greater than a minimum distance between the second opening and the fourth edge.

The first opening may extend parallel to the second opening.

The first opening may extend perpendicular to the second opening.

The set of openings may include a first plurality of openings and a second plurality of openings. The first plurality of openings may include the first opening and may be positioned between the second plurality of openings and the first edge. The second plurality of openings may include the second opening. Each opening of the second plurality of openings may be larger than each opening of the first plurality of openings.

The set of openings may include a first plurality of openings and a second plurality of openings. The first plurality of openings may include the first opening and may surround the second plurality of openings. The second plurality of openings may include the second opening. Each opening of the second plurality of openings may be larger than each opening of the first plurality of openings.

According to embodiments, potential physical breakage between a display area and a peripheral area may be minimized or prevented.

DETAILED DESCRIPTION OF EMBODIMENTS

Example embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

When a first element (such as a layer, film, region, or substrate) is referred to as being "on" a second element, the first element can be directly on the second element, or one or more intervening elements may be present between the first element and the second element.

Figure 1:
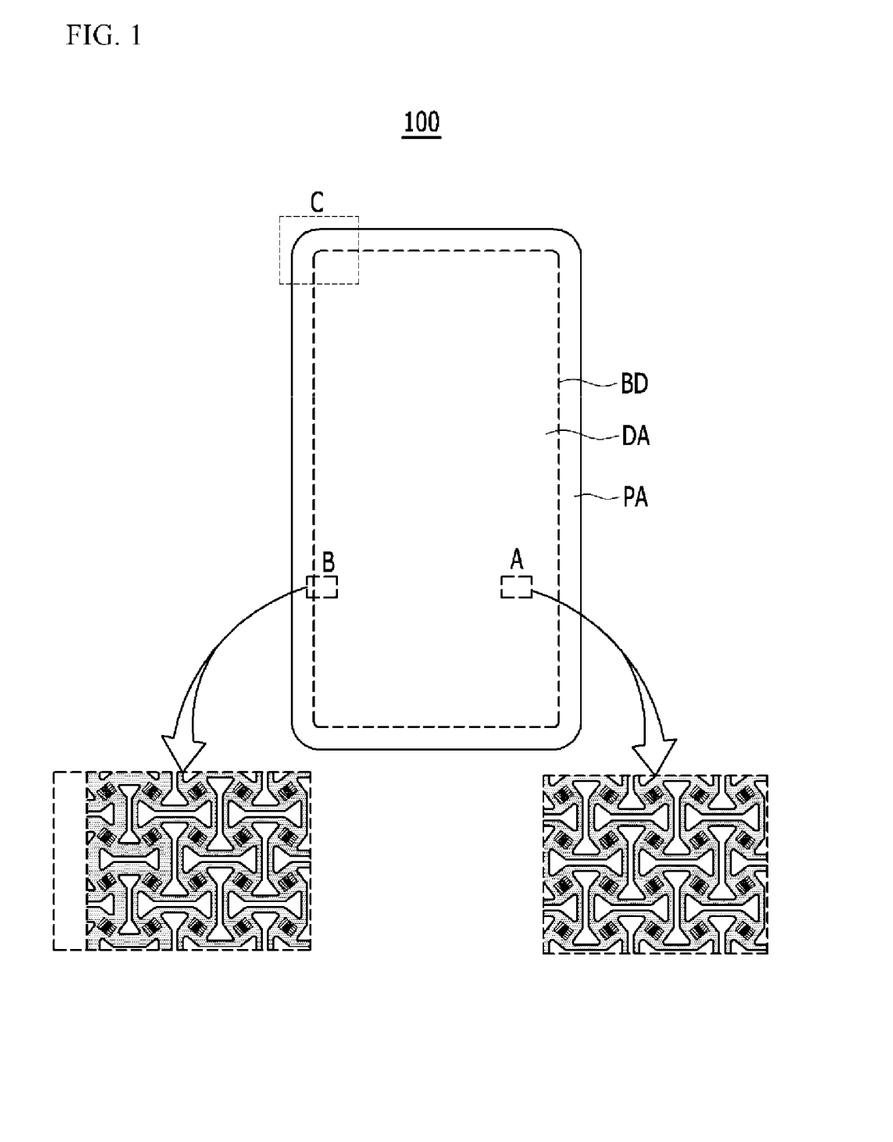
FIG. 1 schematically illustrates a plan view a display panel according to an embodiment.

FIG. 1 schematically illustrates a display panel 100 according to an embodiment.

Figure 2:
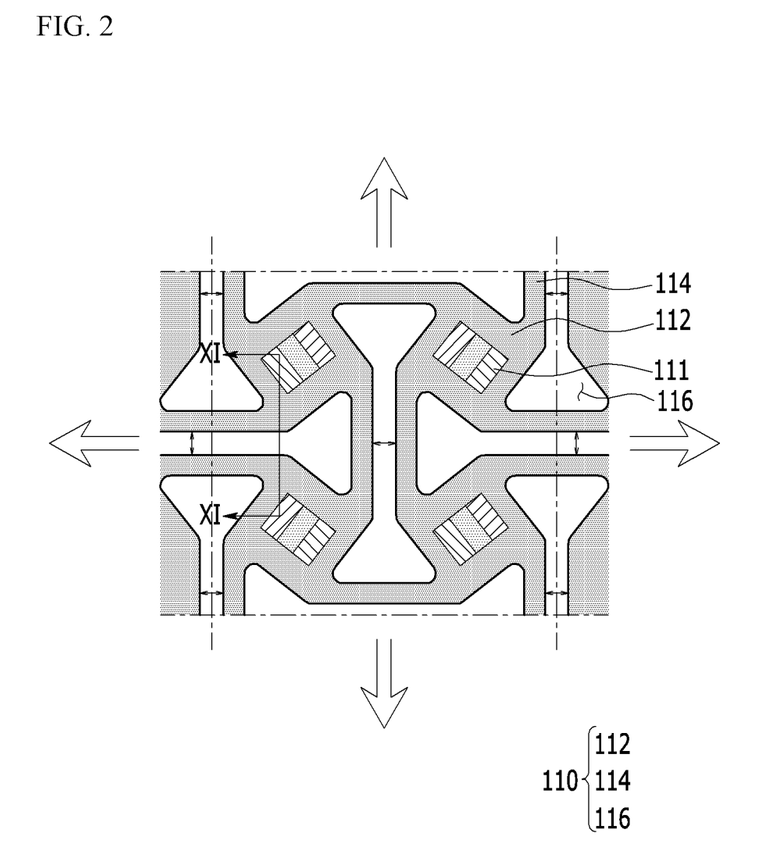
FIG. 2 schematically illustrates a stretchable unit which is not stretched according to an embodiment.
Figure 3:
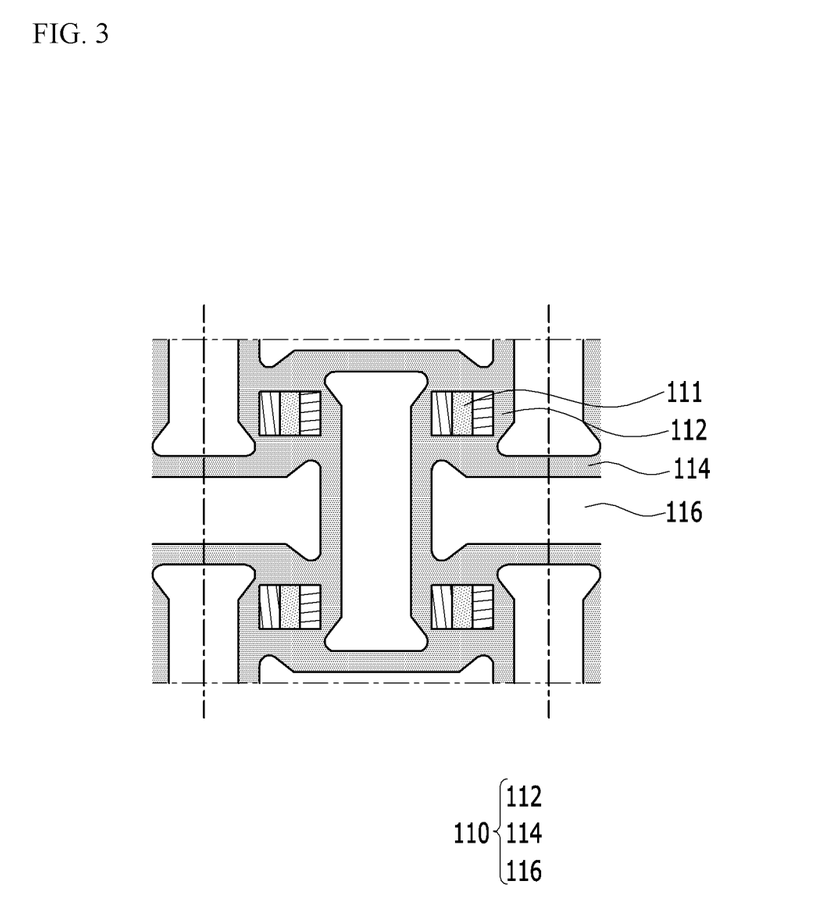
FIG. 3 schematically illustrates a stretched stretchable unit with expanded openings according to an embodiment.

As illustrated in FIG. 1, the display panel 100 according to the present embodiment includes a display area DA and a peripheral area PA. FIG. 2 and FIG. 3 are enlarged views illustrating a portion of an area A of FIG. 1 according to one or more embodiments. FIG. 2 schematically illustrates a stretchable unit 110 which is not stretched, and FIG. 3 schematically illustrates the stretched stretchable unit 110 with expanded openings 116.

In an embodiment, the display area DA may include a plurality of stretchable units 110 (formed of one or more insulating materials) to enable stretching of the display panel 100. A stretchable unit 110 disposed in the display area DA includes one or more islands 112, one or more bridges 114, and one or more openings 116, and is a stretchable basic unit of the stretchable display panel 100. The island 112 indicates an insulating portion in/on which a pixel 111 is disposed.

Islands 112 are disposed apart from each other. A pixel 111 is disposed in each of the islands 112. A red pixel unit, a green pixel unit, and a blue pixel unit are disposed in parallel to constitute a pixel 111 in the enlarged view of the enlarged area A of FIG. 1. In an embodiment, a red pixel unit, a green pixel unit, and a blue pixel unit may be separately disposed on different respective islands 112.

A bridge 114 may extend from a boundary of an island 112 and connect to an immediately adjacent island 112 or may connect an island 112 with the peripheral area PA. Wires that connect the pixels disposed in the islands 112 may be disposed in the bridges 114. The pixels 111 disposed in the islands 112 can be driven by receiving power and electrical signals through the wires disposed in the bridge 114.

An opening 116 may be disposed between bridges 114, between a bridge 114 and an island 112, between a bridge 114 and the peripheral area PA, and/or between an island 112 and the peripheral area PA. The shape and/or area of an opening 116 can be changed for/in stretching of the display panel 100. The opening 116 will be described in more detail with reference to FIG. 2 and FIG. 3.

As illustrated in FIG. 2 and FIG. 3, the display panel 100 is stretched while sizes of openings 116 included in the stretchable unit 110 are changed. In an embodiment, the shapes or areas of island 112 may be substantially maintained, and the positions and/or orientations of the islands 112 may be changed. Therefore, integrity of the pixels 111 disposed on the islands 112 can be substantially maintained without significant breakage regardless of the stretching state of the display panel 100, and an image displayed by the display panel 100 can also be maintained.

In the peripheral area PA, which is disposed at an edge BD of the display area DA, elements such as a driving circuit (for transmitting power and display signals to the pixels 111 disposed in the display area DA), a driving chip, various wires, and a printed circuit board (PCB) are disposed. According to an embodiment, the peripheral area PA may have relatively low elongation as compared to the display area DA in order to protect the elements disposed in the peripheral area PA.

Breakage may occur at the boundary of the bridges 114 or the islands 112 connecting the display area DA and the peripheral area PA because of a difference in elongation between the display area DA (which includes the stretchable unit 110) and the peripheral area PA (which has a relatively low elongation rate). An embodiment may prevent significant breakage of bridges 114 or islands 112 from occurring at a boundary between the display area DA and the peripheral area PA.

According to an embodiment, areas of the islands 112 may (gradually) increase toward the peripheral area PA from the display area DA. Widths of bridges 114 connecting the islands 112 can also (gradually) increase toward the peripheral area PA. In contrast, the areas of openings 116 can (gradually) reduce toward the peripheral area PA.

Figure 4:
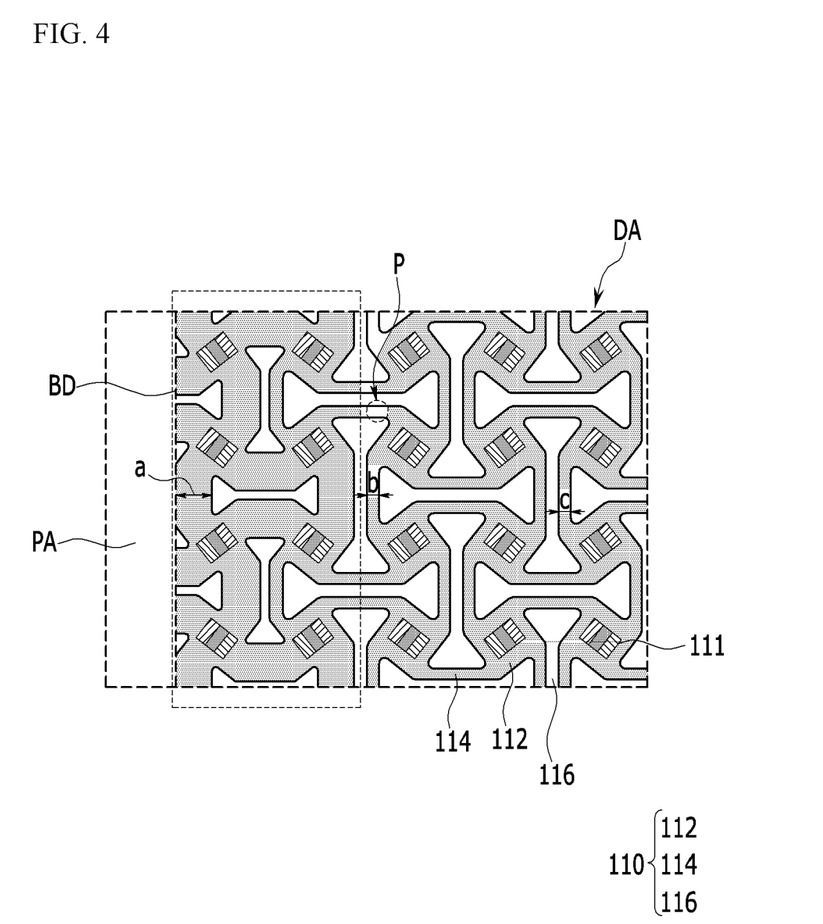
FIG. 4 is an enlarged view schematically illustrating an area B of FIG. 1.
Figure 5:
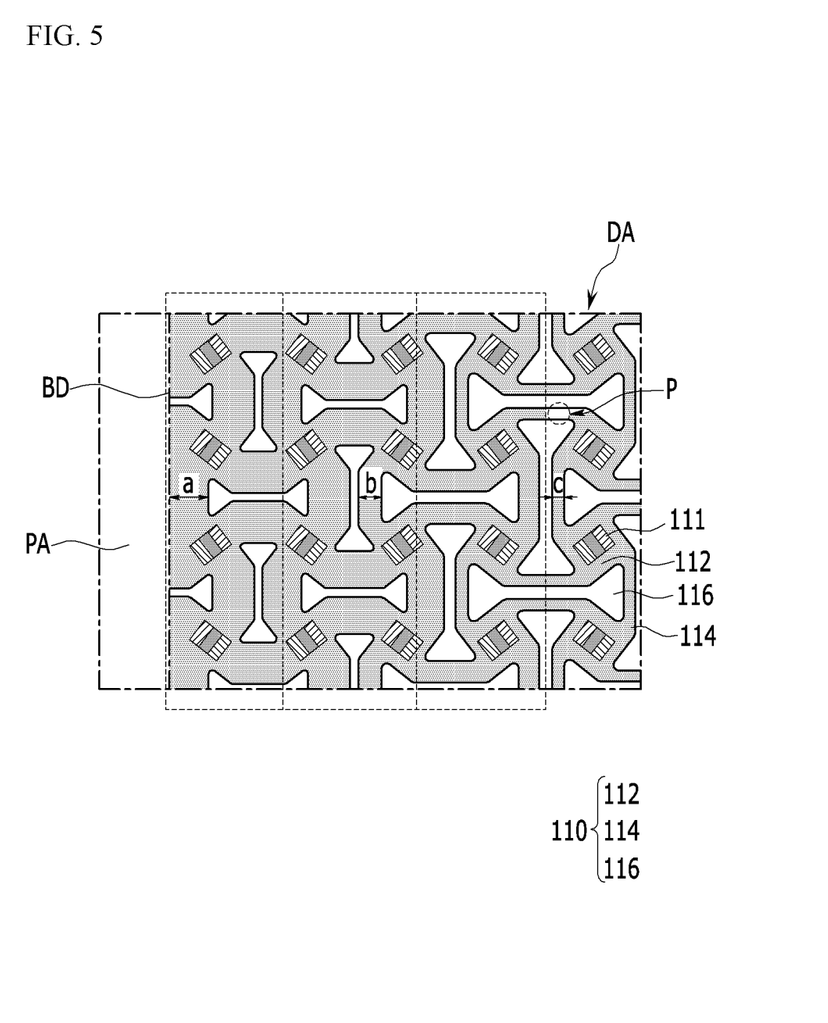
FIG. 5 is an enlarged view schematically illustrating a portion of a display panel according to an embodiment.
Figure 6:
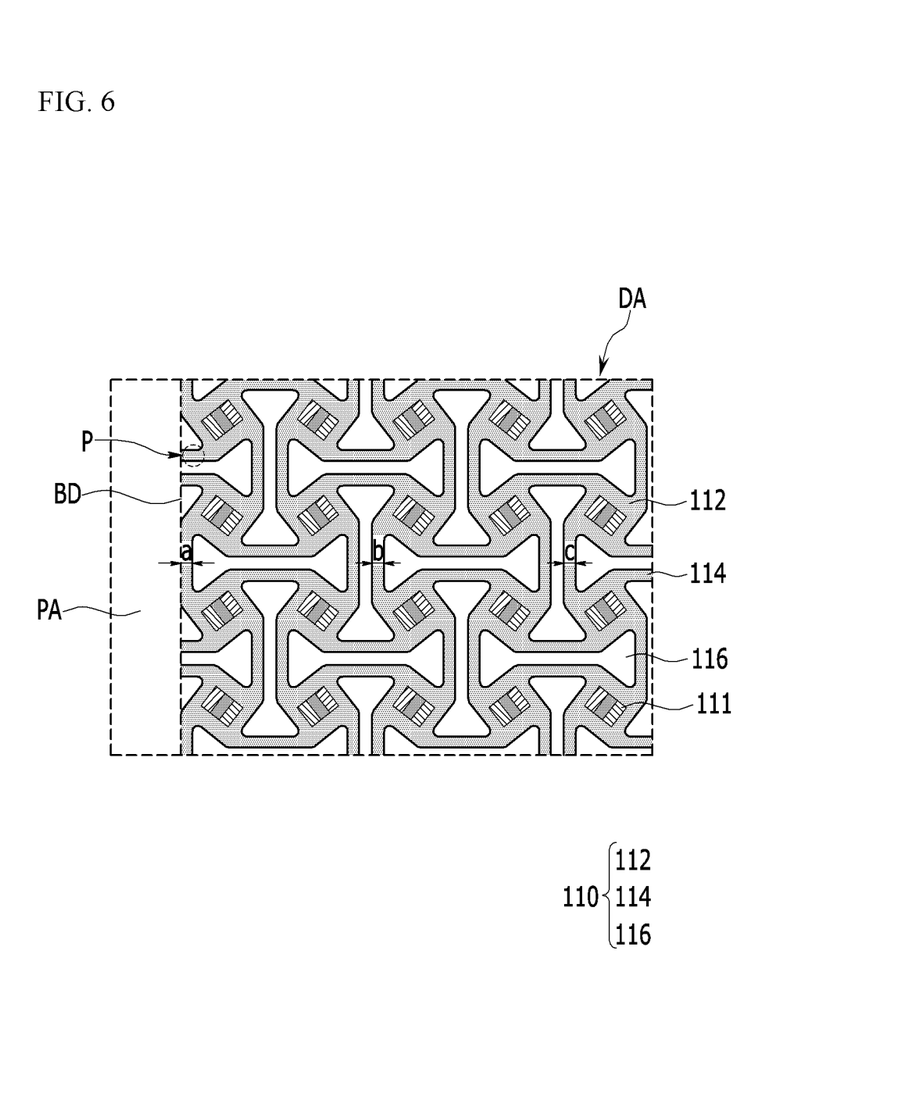
FIG. 6 schematically illustrates a portion of a display panel according to an embodiment.

FIG. 4 is an enlarged view schematically illustrating an area B of FIG. 1 according to an embodiment, and FIG. 5 is an enlarged view schematically illustrating a portion of the display panel 100 according to an embodiment. FIG. 6 schematically illustrates a display panel 100 including a stretchable unit 110 with a constant opening size according to an embodiment and as a comparative example.

As illustrated in FIG. 4, the display panel 100 according to an embodiment includes a stretchable unit 110 including an island 112 having a wider area, a bridge 114 having a wider width, and an opening 116 having a narrower area near the peripheral area PA. FIG. 4 illustrates that one stretchable unit 110 adjacent to the peripheral area PA has configurations (e.g., smaller openings) different from other stretchable unit 110. In an embodiment, different configurations may be applicable to one or more (e.g., up to ten) stretchable units 110 from the boundary between the display area DA and the peripheral region PA further into the DA, e.g., in a horizontal direction or a vertical direction.

FIG. 5 schematically illustrates configuration differences of three stretchable units 110 according to an embodiment. FIG. 5 illustrates four area sizes for islands 112, four area sizes for openings 116, and four widths for bridges 114. Toward the peripheral area PA, areas of islands 112 (gradually) may increase, widths of bridge 114 may increase, but areas of the opening 116 may decrease.

Although islands 112 have different sizes, the pixels 111 disposed in the islands 112 may all have the same size.

Referring to FIG. 4 and FIG. 5, a distance "a" between the PA and an opening 116 (without any intervening opening) is greater than a bridge width "b" (or a distance "b" between two openings 116 farther from the PA) and greater than a bridge width "c" (or a distance "c" between two openings 116 still farther from the PA).

Referring to FIG. 4, the width/distance b may be equal to the width/distance c but less than the width/distance a.

FIG. 5 illustrates that the width/distance b is greater than the width/distance c, and that the width/distance a is greater than the width/distance b, and thus the bridges 114 have wider widths toward the edge BD of the display area DA.

An area of an island 112 that is closest to the edge BD of the display panel 100 may be wider than that of an island 112 farther from the edge BD. The area of an opening 116 that is closest to the edge BD of the display panel 100 may be less than that of other openings 116. A shape of an opening 116 that is closest to the edge BD may be different from other openings 116 as if part of the opening 116 has been cut off due to the boundary with the edge BD.

FIG. 6 schematically illustrates that a bridge width "a" (or distance "a" between an opening and the edge BD of the display panel 100) is equal to the bridge width "b" (or distance "b" between two openings 116 farther from the edge BD) and is equal to the bridge width "c" (or distance "c" between two openings 116 still farther from the edge BD).

Since an area of the island 112 that immediately neighbors the peripheral area PA illustrated in FIG. 6 is narrower than that of FIG. 4 and FIG. 5, and since a width of the bridge 114 is narrower than that of FIG. 4 and FIG. 5, there is a higher probability that breakage will occur in the islands 112 or the bridges 114 illustrated in FIG. 6.

Table 1 shows stain values of the bridges 114 included in each stretchable unit 110 measured by stretching each of the display panels 100 illustrated in FIG. 4, FIG. 5, and FIG. 6 by 5%. For each example, the strain of the bridge 114 was measured at points indicated by P in each of FIG. 4, FIG. 5, and FIG. 6. The points P of FIG. 4, FIG. 5, and FIG. 6 indicate points where the islands 112, the bridges 114, and the openings 116 start to have new configurations.

TABLE 1

|  | FIG. 4 (Example 1) | FIG. 5 (Example 2) | FIG. 6 (Comparative Example) |
| --- | --- | --- | --- |
| Strain (%) | 0.62 | 0.53 | 1.95 |

As shown in Table 1, when FIG. 4 and FIG. 6 are compared, a value of strain generated by stress concentration in Example 1 of FIG. 4 (in which areas of the islands 112 are increased, widths of the bridges 114 are increased toward the edge BD of the display area DA, and areas of the openings 116 are reduced) is significantly lower than a value of strain generated by stress concentration in the Comparative Example of FIG. 6.

In addition, when FIG. 4 and FIG. 5 are compared, a strain value of Example 2 illustrated in FIG. 5 (in which areas of the islands 112 of three stretchable units 110 are increased, widths of the bridges 114 are increased, and areas of the openings 116 are further reduced) is lower than a value of stain associated with Example 1 illustrated in FIG. 4.

According to an embodiment, gradual structure size decrease/increase may be implemented for stretchable units 110 from the peripheral area PA of the display panel 100, i.e., the edge BD of the display area DA, up to an area corresponding to 1% of the length/width of the display panel 100 or 1% of the length/width of the display area DA.

In other words, the areas of islands 112 are gradually increased, the widths of the bridges 114 are gradually increased, and the areas of the openings 116 are gradually reduced, from the display area DA toward the peripheral area PA of the display panel 100, i.e., the edge BD of the display area DA. If only one stretchable unit 110 has a special configuration, the conditions are the same as those of FIG. 4 and Table 1, and the strain is significantly reduced as compared with the Comparative Example.

A gradual structure size change/decrease/increase may be implemented for the stretchable units 110 disposed in an area corresponding to 1% of the length/width of the display panel 100 or 1% of the length/width of the display area DA. If the gradual structure size change is formed in an area that is beyond 1% of the length of the display panel 100, a similar effect may be obtained. However, the effect is weak. As a result, an upper limit of 1% of the length of the display panel 100 was selected as a value at which the effect reached a threshold and no significant further increase in the effect could be expected.

FIG. 4, FIG. 5, and FIG. 6 schematically illustrate an area B of FIG. 1. Similar to the area B, an area C of FIG. 1 may include a gradual structure size change.

FIG. 1 to FIG. 6 illustrate that openings 116 of stretchable units have dumbbell-shaped plan views or dumbbell-shaped cross-sections cut along a direction parallel to a display surface with respect to an axis perpendicular to the display surface of the display panel 100. Openings 116 may have one or more of other shapes.

Figure 7:
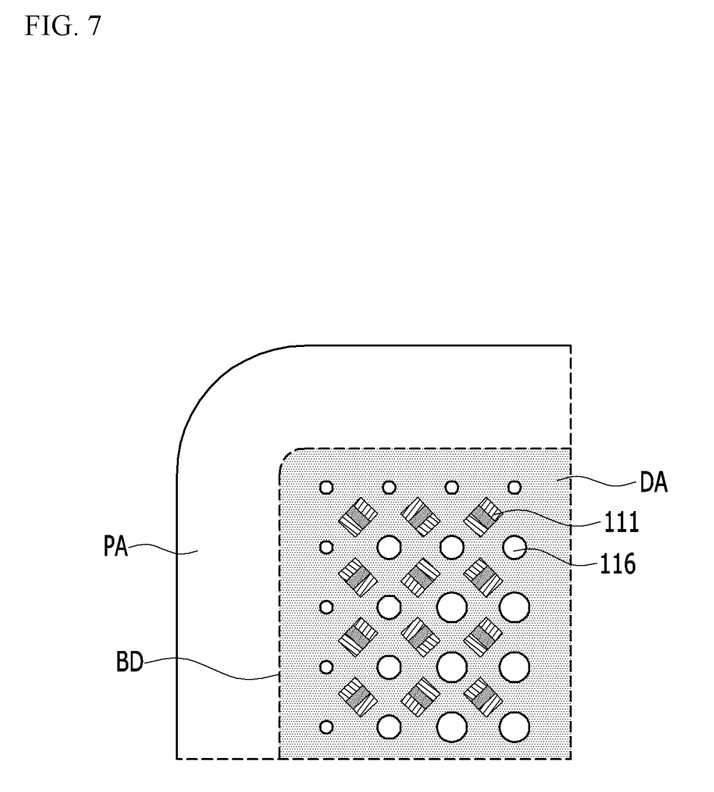
FIG. 7 schematically illustrates an area C of FIG. 1 according to an embodiment.
Figure 8:
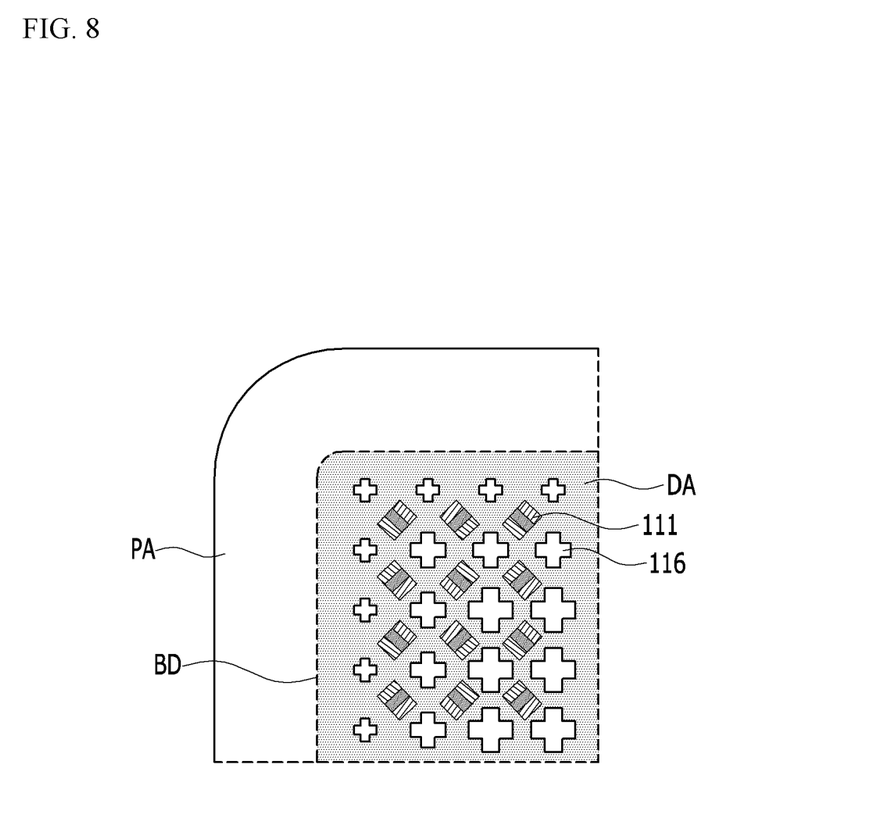
FIG. 8 schematically illustrates an area C of FIG. 1 according to an embodiment.
Figure 9:
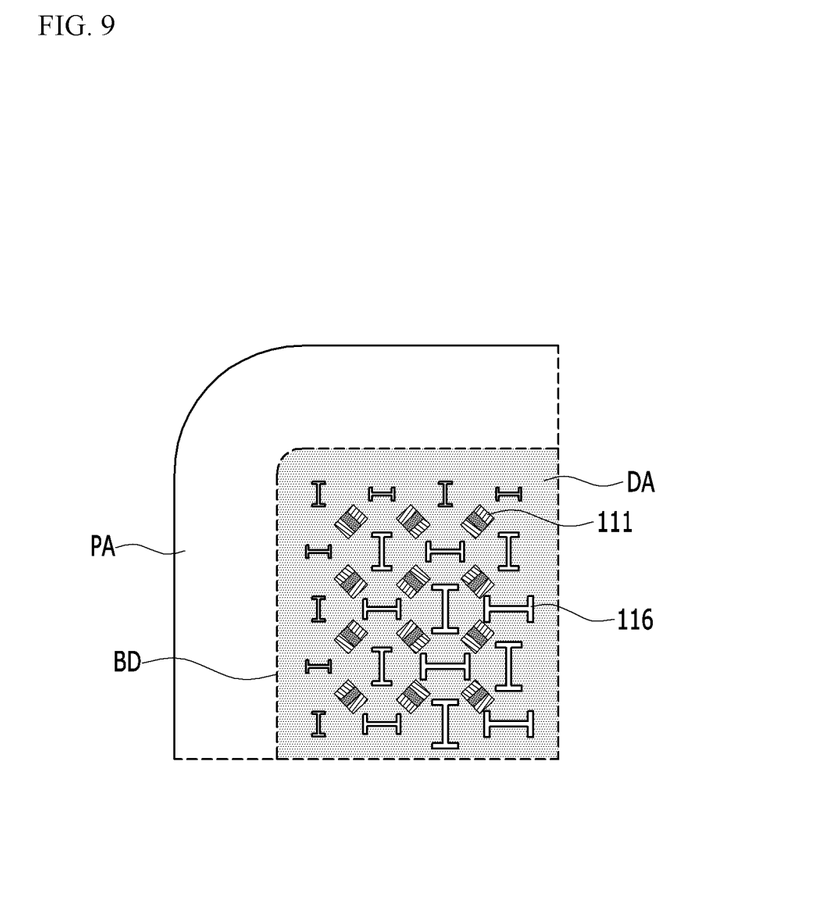
FIG. 9 schematically illustrates an area C of FIG. 1 according to an embodiment.
Figure 10:
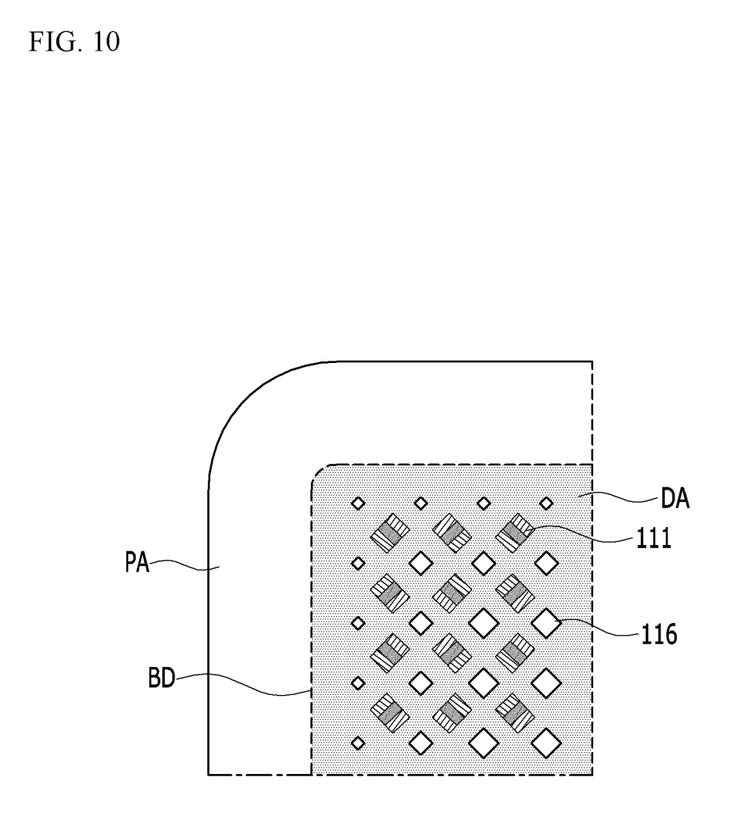
FIG. 10 schematically illustrates an area C of FIG. 1 according to an embodiment.

FIG. 7 schematically illustrates a circular opening 116 in an area C of FIG. 1 according to an embodiment. FIG. 8 schematically illustrates a cross-shaped opening 116 in an area C of FIG. 1 according to an embodiment. FIG. 9 schematically illustrates a flange-shaped opening 116 in an area C of FIG. 1 according to an embodiment. FIG. 10 schematically illustrates a polygonal opening 116 in an area C of FIG. 1 according to an embodiment.

FIG. 7 to FIG. 10 illustrate that openings 116 may have one more of a circular-shaped cross-section, a cross-shaped cross-section, a flange-shaped cross-section, and a polygonal-shaped cross-section. A cross-section may indicate a surface cut along a direction parallel to a display surface with respect to an axis perpendicular to the display surface of the display panel 100. FIG. 7 to FIG. 10 schematically illustrated that an area of an opening 116 closest to an edge BD or a corner is less than an area of an opening 116 farther from the edge BD. In addition, as illustrated in FIG. 7 to FIG. 10, the pixels 111 may be disposed between the openings 116.

An embodiment may include elliptical openings 116. In embodiments, cross-shaped openings 116 may have rounded edges, or crossed portions of openings 116 are connected with curved or inclined surfaces. In embodiments, flange-shaped openings 116 may have rounded or polygon-shaped edges. In embodiments, crossed portions between flanges and columns are connected with curved or inclined surfaces. In embodiments, polygonal openings 116, e.g., quadrangular openings 116, may have rounded corners or rounded sides.

Figure 11:
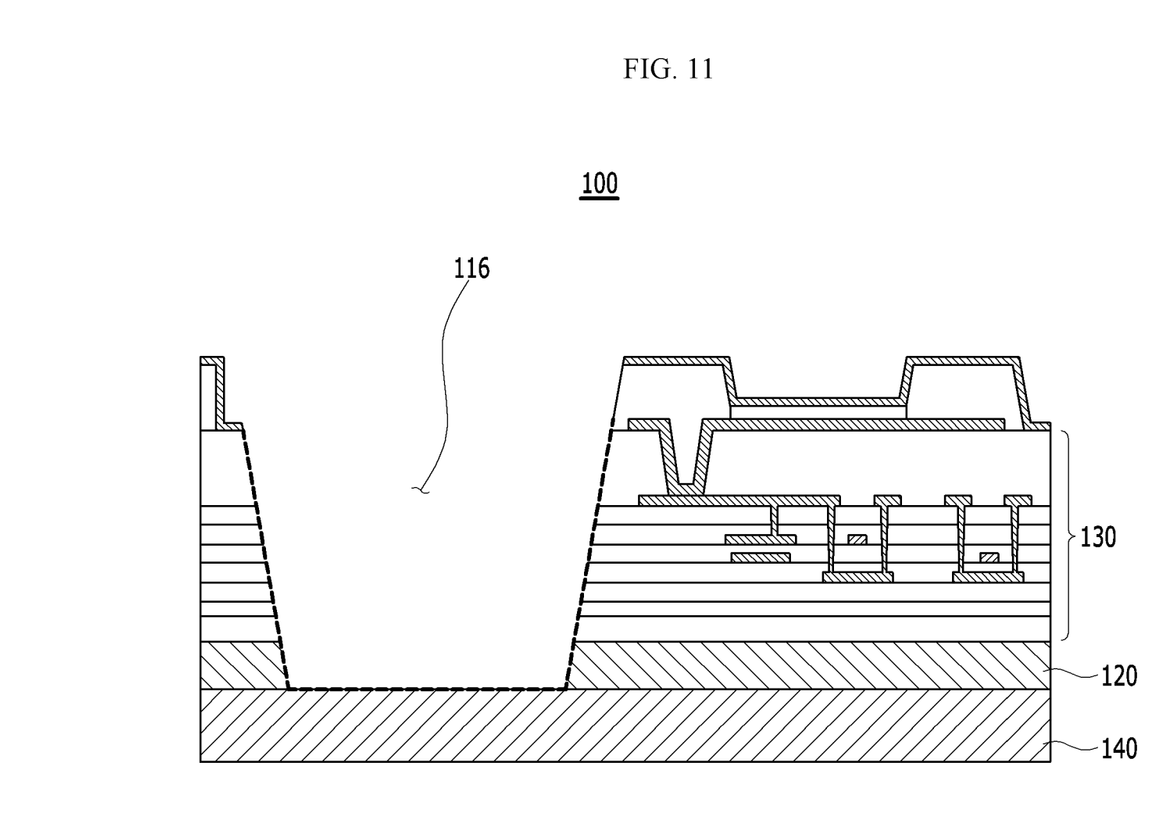
FIG. 11 is a cross-sectional view taken along a line XI-XI of FIG. 2.

FIG. 11 is a cross-sectional view taken along a line XI-XI of FIG. 2 according to an embodiment. FIG. 11 schematically illustrates a portion of the display area DA of the display panel 100 of FIG. 1 cut in a direction perpendicular to the display surface. An organic light emitting diode display panel 100 including an organic light emitting diode may be provided as an example of the display panel 100 illustrated in FIG. 11. The display panel 100 may include alternative or additional display elements.

The display panel 100 may include a carrier substrate 140, a substrate 120 fixed to the carrier substrate 140, and a plurality of insulating layers 130 stacked on the substrate 120. One or more of the insulating layers 130 may include stretchable units 110 (including elements 112, 114, and 116). The insulating layers 130 are stacked to electrically insulate constituent elements such as various wires, semiconductor layers, or transistors formed on the substrate 120, or to perform planarization on the surface thereof.

The display panel 100, the insulating layers 130, the carrier substrate 140, and/or the substrate 120 may include the openings 116. As described above, the openings 116 are portions of the stretchable units 110 for facilitating stretching of the display panel 100.

Referring to FIG. 11, the openings 116 extend not only through the insulating layers 130 but also through the substrate 120, so that the carrier substrate 140 may be exposed. In an embodiment, the openings 116 extend through the insulating layers 130 without extending through or extending into the substrate 120. In an embodiment, the openings 116 may extend through a first group of the insulating layers 130 without extending through or extending into the substrate 120 or a second group of the insulating layers 130. In an embodiment, after the carrier substrate 140 is removed, a protection layer may be attached onto a bottom surface of the substrate 120.

According to embodiments, the display panel 100 including the stretchable unit 110 may effectively minimize or prevent significant physical breakage between the display area DA and the peripheral area PA.

Although example embodiments have been described, practical embodiments are not limited to the described embodiments. Various changes and modifications may be made to these embodiments without departing from the spirit and the scope defined by the appended claims.

DESCRIPTION OF SYMBOLS

100: display panel
110: stretchable unit
111: pixel
112: island
114: bridge
116: opening
120: substrate
130: insulating layer
140: carrier substrate DA: display area
PA: peripheral area
BD: edge

What is claimed is:

1. A flexible display panel comprising
a display area including a plurality of stretching structures; and
a peripheral area positioned at an edge of the display area,
wherein the stretching structures include:
a plurality of islands each including at least one pixel;
a plurality of bridges extending from the islands and connecting adjacent islands; and
a plurality of openings surrounded by the bridges and the islands,
wherein areas or widths of the bridges increase towards the peripheral area, and
wherein the at least one pixel rotates when the flexible display panel is stretched.

2. The flexible display panel of claim 1, wherein shapes of the islands include a substantially tetragonal shape.

3. The flexible display panel of claim 1, wherein the widths of the bridges gradually increase toward the peripheral area.

4. The flexible display panel of claim 1, wherein the areas of the bridges gradually increase toward the peripheral area.

5. The flexible display panel of claim 1, further comprising:
a substrate configured to include the display area and the peripheral area; and
a plurality of insulating layers disposed on the substrate,
wherein the openings penetrate through the insulating layers and the substrate.

6. The flexible display panel of claim 1, wherein the bridges include a first bridge and a second bridge closer to the peripheral area than the first bridge, wherein a width of the first bridge is smaller than a width of the second bridge.

7. The flexible display panel of claim 6, wherein an area of the first bridge is smaller than an area of the second bridge.

8. The flexible display panel of claim 1, wherein four bridges extend from each of the islands.

9. The flexible display panel of claim 1, wherein each of the islands includes a red pixel, a green pixel, and a blue pixel.

10. The flexible display panel of claim 1, wherein the islands are arranged in a first direction and a second direction crossing the first direction, and the at least one pixel in the islands is arranged in a direction inclined with respect to the first direction or the second direction.

11. The flexible display panel of claim 1, wherein the bridges extend in a first direction or in a second direction crossing the first direction.

12. A flexible display panel comprising:
a display area including a plurality of stretching structures; and
a peripheral area positioned at an edge of the display area,
wherein the stretching structures include:
a plurality of islands each including at least one pixel;
a plurality of bridges extending from the islands and connecting adjacent islands; and
a plurality of openings surrounded by the bridges and the islands,
wherein areas of the openings decrease toward the peripheral area, and
wherein at least one of the openings includes a central portion having a first width, a first side portion at one side of the central portion and having a width larger than the first width, and a second side portion at the other side of the central portion and having a width larger than the first width.

13. The flexible display panel of claim 12, wherein shapes of the islands include a substantially tetragonal shape.

14. The flexible display panel of claim 12, wherein areas of the openings gradually decrease toward the peripheral area.

15. The flexible display panel of claim 12, further comprising:
a substrate configured to include the display area and the peripheral area; and
a plurality of insulating layers disposed on the substrate,
wherein the openings penetrate through the insulating layers and the substrate.

16. The flexible display panel of claim 12, wherein each of the islands includes a red pixel, a green pixel, and a blue pixel.

17. The flexible display panel of claim 12, wherein the islands are arranged in a first direction and a second direction different from the first direction, and edges of pixels in some of the islands are aligned in a direction inclined with respect to each of the edge of the display area and the first direction.

18. The flexible display panel of claim 12, wherein each of the openings has a first end portion, a second end portion, and a center portion between the first and second end portions, and wherein an area of the first and second end portions is greater than an area of the center portion.

19. The flexible display panel of claim 18, wherein shapes of the first and second end portions include a substantially triangular shape.

20. The flexible display panel of claim 12, wherein each of the openings is defined by four of the bridges and four of the islands.

21. The flexible display panel of claim 12, wherein an edge of the at least one pixel is oblique relative to each of the edge of the display area and an alignment direction of three of the openings in a plan view of the flexible display panel, and
wherein sizes of three of the openings are different from each other.

* * * * *